US010128366B2

(12) United States Patent
Lin et al.

(10) Patent No.: US 10,128,366 B2
(45) Date of Patent: *Nov. 13, 2018

(54) FIELD-EFFECT TRANSISTOR

(71) Applicant: UNITED MICROELECTRONICS CORP., Hsin-Chu (TW)

(72) Inventors: Yu-Ying Lin, Tainan (TW); Kuan Hsuan Ku, Tainan (TW); I-Cheng Hu, Kaohsiung (TW); Chueh-Yang Liu, Tainan (TW); Shui-Yen Lu, Tainan (TW); Yu Shu Lin, Pingtung County (TW); Chun Yao Yang, Kaohsiung (TW); Yu-Ren Wang, Tainan (TW); Neng-Hui Yang, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/890,303

(22) Filed: Feb. 6, 2018

(65) Prior Publication Data

US 2018/0158943 A1 Jun. 7, 2018

Related U.S. Application Data

(60) Continuation of application No. 15/628,028, filed on Jun. 20, 2017, now Pat. No. 9,929,264, which is a
(Continued)

(51) Int. Cl.
*H01L 21/00* (2006.01)
*H01L 29/78* (2006.01)
*H01L 21/225* (2006.01)

*H01L 29/06* (2006.01)
*H01L 21/768* (2006.01)
(Continued)

(52) U.S. Cl.
CPC .......... *H01L 29/78* (2013.01); *H01L 21/2254* (2013.01); *H01L 21/31144* (2013.01); *H01L 21/76877* (2013.01); *H01L 27/0922* (2013.01); *H01L 29/0688* (2013.01); *H01L 29/165* (2013.01); *H01L 29/41783* (2013.01)

(58) Field of Classification Search
CPC ... H01L 29/78; H01L 27/0922; H01L 29/165; H01L 29/41783
See application file for complete search history.

(56) References Cited

U.S. PATENT DOCUMENTS 6,037,216 A 3/2000 Liu
6,261,921 B1 * 7/2001 Yen .................... H01L 21/76232
257/E21.549
(Continued)

*Primary Examiner* — Nicholas Tobergte
(74) *Attorney, Agent, or Firm* — Winston Hsu

(57) ABSTRACT

A semiconductor device includes a semiconductor substrate, a gate structure formed over the semiconductor substrate, and an epitaxial structure formed partially within the semiconductor substrate. The gate structure includes a gate dielectric layer formed over the semiconductor substrate, a gate electrode formed over the gate dielectric layer, and a spacer formed on side surfaces of the gate dielectric layer and the gate electrode. A laterally extending portion of the epitaxial structure extends laterally at an area below a top surface of the semiconductor substrate in a direction toward an area below the gate structure. A lateral end of the laterally extending portion is below the spacer.

15 Claims, 15 Drawing Sheets

Related U.S. Application Data division of application No. 15/188,194, filed on Jun. 21, 2016, now Pat. No. 9,716,165.

(51) Int. Cl.
*H01L 21/311* (2006.01)
*H01L 29/417* (2006.01)
*H01L 29/165* (2006.01)
*H01L 27/092* (2006.01)

(56) References Cited

U.S. PATENT DOCUMENTS

| | | |
|---|---|---|
| 6,432,776 B1 | 8/2002 | Ono |
| 6,465,315 B1 | 10/2002 | Yu |
| 7,494,858 B2 | 2/2009 | Bohr |
| 7,821,044 B2 | 10/2010 | Bohr |
| 8,049,286 B2 | 11/2011 | Tateshita |
| 8,334,197 B2 | 12/2012 | Lee |
| 8,450,775 B2 | 5/2013 | Chong |
| 8,502,284 B2 | 8/2013 | Tamura |
| 8,569,139 B2 | 10/2013 | Nieh |
| 8,604,550 B2 | 12/2013 | Lee |
| 8,618,556 B2 | 12/2013 | Wu |
| 8,674,453 B2 * | 3/2014 | Tsai ................. H01L 21/26506 257/213 |
| 8,709,897 B2 * | 4/2014 | Sung ................. H01L 21/26586 257/192 |
| 8,828,832 B2 | 9/2014 | Tsai |
| 8,963,258 B2 | 2/2015 | Yu |
| 8,994,104 B2 * | 3/2015 | Glass ..................... H01L 29/36 257/335 |
| 8,999,794 B2 | 4/2015 | Fang |
| 9,013,003 B2 | 4/2015 | Liang |
| 9,054,130 B2 | 6/2015 | Peng |
| 9,111,906 B2 | 8/2015 | Lin |
| 9,112,027 B2 | 8/2015 | Shimamune |
| 9,142,642 B2 | 9/2015 | Chen |
| 9,142,643 B2 | 9/2015 | Cheng |
| 9,716,165 B1 * | 7/2017 | Lin ........................ H01L 29/78 |
| 2004/0031996 A1 | 2/2004 | Brian Li |
| 2005/0059228 A1 | 3/2005 | Bu |
| 2007/0298557 A1 | 12/2007 | Nieh |
| 2008/0073715 A1 | 3/2008 | Park |
| 2011/0065245 A1 | 3/2011 | Chen |
| 2011/0117679 A1 | 5/2011 | Lee |
| 2012/0309171 A1 | 12/2012 | Lu |
| 2015/0243747 A1 | 8/2015 | Kittl |
| 2015/0318282 A1 | 11/2015 | Rodder |
| 2015/0340487 A1 * | 11/2015 | Siemieniec ........... H01L 21/046 257/77 |
| 2015/0380521 A1 | 12/2015 | Chang |

\* cited by examiner

FIELD-EFFECT TRANSISTOR

CROSS REFERENCE TO RELATED APPLICATIONS

This application is a continuation of application Ser. No. 15/628,028 filed on Jun. 20, 2017, which is a division of application Ser. No. 15/188,194 filed on Jun. 21, 2016, now U.S. Pat. No. 9,716,165, and the entire contents of which is hereby incorporated by reference.

BACKGROUND OF THE INVENTION

1. Field of the Invention

The disclosure relates to a semiconductor device and, more particularly, to a semiconductor field-effect transistor.

2. Description of the Prior Art

With the development of technologies in the semiconductor integrated circuit industry, more and more semiconductor devices can be integrated in one semiconductor integrated circuit (IC), and the size of individual semiconductor devices becomes smaller and smaller. A field-effect transistor (FET) is a typical semiconductor device that constitutes a basic unit of a semiconductor IC. An FET includes a gate structure formed over a semiconductor substrate, as well as a source and a drain formed in the semiconductor substrate and close to the gate structure. Conventionally, the source and drain are formed by doping the semiconductor substrate. With the increasing of the integration level of IC's and the scaling down of the FETs in the IC's, different processes have been developed for forming the source and drain.

One of these processes involves using an epitaxial technique to form the source and drain. According to this process, the semiconductor substrate is etched to form recesses, also referred to as "S/D recesses," and then a semiconductor material is deposited in the recesses to form the source and drain. In some FETs, the semiconductor material is also deposited above the S/D recesses, and the resulting sources or drains are also referred to as raised sources or raised drains having an elevated portion above the surface of the substrate. The recesses can be hexagonal-shaped recesses, also referred to as sigma-shaped recesses. The process of forming the hexagonal-shaped recesses can include a dry etching to form U-shaped recesses and then a wet etching to form the hexagonal-shaped recesses.

The semiconductor material deposited in the recesses can be different for different types of FETs. For example, for a P-channel FET formed in a silicon (Si) substrate, silicon-germanium (SiGe) can be deposited in the recesses to form the source and drain. Since SiGe has a larger lattice constant than Si, an SiGe source/drain introduces a compressive stress in the channel of the FET, which increases the hole mobility in the channel. Further, for an N-channel FET formed in an Si substrate, phosphorous-doped Si (Si:P) can be deposited in the recesses to form the source and drain.

FIG. 1 schematically shows a conventional semiconductor device 100 including a substrate 102, two gate structures 104 formed over the substrate 102, a hexagonal-shaped S/D recess 106 formed in the substrate 102 and between the gate structures 104 according to conventional technology, and a raised source/drain 108 formed in and over the S/D recess 106 and between the gate structures 104. Each of the gate structures 104 includes a gate dielectric layer 104-2 formed over the substrate 102, a gate electrode 104-4 formed over the gate dielectric layer 104-2, a cap layer 104-6 formed over the gate electrode 104-4, and a spacer 104 8 formed on the side surface of the gate structure, i.e., the side surfaces of the gate dielectric layer 104-2, the gate electrode 104-4, and the cap layer 104-6.

The source/drain 108 includes a buried portion 108-2 formed in the S/D recess 106 and an elevated portion 108-4 formed over the S/D recess 106, i.e., above the top surface of the substrate 102. In the semiconductor device 100, the distance between the elevated portion 108-4 and the gate electrode 104-4, also referred to herein as an "S2G distance," is determined by the thickness of the spacer 104-8.

The inventors have observed that the conventional semiconductor device 100 has structural and operational deficiencies.

SUMMARY OF THE INVENTION

In accordance with the disclosure, there is provided a semiconductor device including a semiconductor substrate, a gate structure formed over the semiconductor substrate, and an epitaxial structure formed partially within the semiconductor substrate. The epitaxial structure serves as one of a source or drain region corresponding to the gate structure. The gate structure includes a gate dielectric layer formed over the semiconductor substrate, a gate electrode formed over the gate dielectric layer, and a spacer formed on side surfaces of the gate dielectric layer and the gate electrode. A laterally extending portion of the epitaxial structure extends laterally at an area below a top surface of the semiconductor substrate in a direction toward an area below the gate structure. A lateral end of the laterally extending portion is below the spacer.

Also in accordance with the disclosure, there is provided a method for forming a semiconductor device. The method includes forming a gate structure over a semiconductor substrate, forming a capping layer over the semiconductor substrate and the gate structure, implanting arsenic into the semiconductor substrate through the capping layer and using the gate structure as a mask to form an implanted region in the semiconductor substrate, removing the capping layer, forming an etching spacer on a side surface of the gate structure, and etching the implanted region using the gate structure and the etching spacer as a mask to form a recess in the semiconductor substrate. The recess includes an undercut region directly beneath the etching spacer.

Also in accordance with the disclosure, there is provided an epitaxial structure formed partially within a semiconductor substrate. The epitaxial structure includes a vertically extending portion extending vertically above a top surface of the semiconductor substrate and a laterally extending portion extending laterally at an area below the top surface of the semiconductor substrate and beyond an area where the vertically extending portion extends vertically. The vertically extending portion joins the laterally extending portion at a rounded corner.

Features and advantages consistent with the disclosure will be set forth in part in the description which follows, and in part will be obvious from the description, or may be learned by practice of the disclosure. Such features and advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, embodiments consistent with the disclosure will be described with reference to the drawings. Wherever possible, the same reference numbers will be used throughout the drawings to refer to the same or like parts.

Embodiments consistent with the disclosure include a semiconductor field-effect transistor having an undercut source/drain and a method of making the same.

Figure 1:
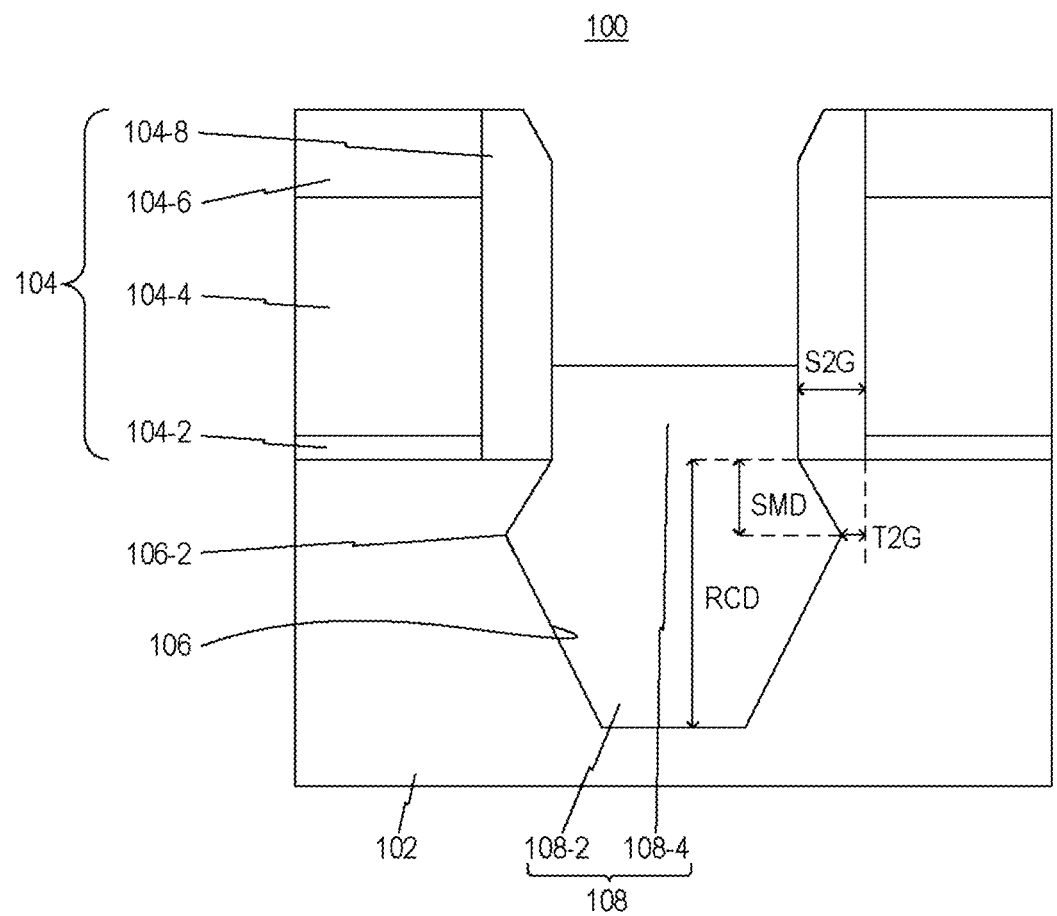
FIG. 1 is a cross-sectional view schematically showing a conventional semiconductor device.

The inventors have observed that the conventional semiconductor device 100 shown in FIG. 1 has structural and operational deficiencies, and have discovered new ways to construct an FET without such deficiencies.

As shown in FIG. 1, the hexagonal-shaped S/D recess 106 includes recess tips 106-2, which overlap with tips of the buried portion 108-2 of the source/drain 108. The horizontal distance from the recess tip 106-2 to a vertical plane on which the side surface of the gate electrode 104-4 is disposed is referred to herein as a "T2G distance." In this disclosure, the terms "horizontal/horizontally" and "vertical/vertically," when used to describe directional relations associated with a device, are relative to the orientation of the device as shown in one of the accompanying drawings. These terms are used to facilitate description and not a required orientation of the illustrated devices. The T2G distance can be positive or negative. A positive T2G distance means the recess tip 106-2 has not reached the vertical plane on which the side surface of the gate electrode 104-4 is disposed, i.e., the recess tip 106-2 is not beneath the gate electrode 104-4, as shown in FIG. 1. On the other hand, a negative T2G distance means the recess tip 106-2 is beyond the vertical plane on which the side surface of the gate electrode 104-4 is disposed, i.e., the recess tip 106-2 is beneath the gate electrode 104-4. The vertical distance from the recess tip 106-2 to the surface of the substrate 102 is referred to herein as a "sigma depth" or "SMD." Further, the vertical distance from the bottom of the S/D recess 106 to the surface of the substrate 102 is referred to herein as a "recess depth" or "RCD."

In the semiconductor device 100 shown in FIG. 1, the T2G distance, the sigma depth, and the recess depth can be controlled by controlling etching conditions for forming the S/D recess 106. Usually, with a longer etching time, the T2G distance decreases and the sigma depth increases. The T2G distance also depends on the S2G distance and increases when the S2G distance increases. The S2G distance, the T2G distance, and the sigma depth need to be controlled to optimize the performance of the semiconductor device 100.

The elevated portion 108-4 of the source/drain 108, the gate electrode 104-4, and the spacer 104-8 sandwiched between the elevated portion 108-4 of the source/drain 108 and the gate electrode 104-4 form a parasitic capacitor. The capacitance, $C_{ov}$, of the parasitic capacitor can be affected by the S2G distance. Generally, a smaller S2G distance results in a larger $C_{ov}$, which in turn increases the RC delay of the semiconductor device 100 and thus reduces the operating speed of the semiconductor device 100. Therefore, to reduce the negative impact on the operating speed of the semiconductor device 100, the S2G distance should be made larger. However, as discussed above, a larger S2G distance can cause a larger T2G distance, i.e., the recess tip 106-2 is farther away from the channel below the gate electrode 104-4. As a result, in the case that the substrate 102 is Si and the source/drain 108 is SiGe, the stress introduced by the source/drain 108 in the channel becomes smaller and thus the hole mobility in the channel becomes smaller. A smaller hole mobility will result in a slower operating speed of the semiconductor device 100. Although increasing the etching time when forming the recess 106 can reduce the T2G distance, the sigma depth is increased and the recess tip 106-2 moves vertically away from the channel. That is, increasing the etching time generally does not help to increase the hole mobility. Moreover, both the sigma depth and the recess depth should be kept within a certain range, which prevents further increasing the etching time.

Figure 2A:
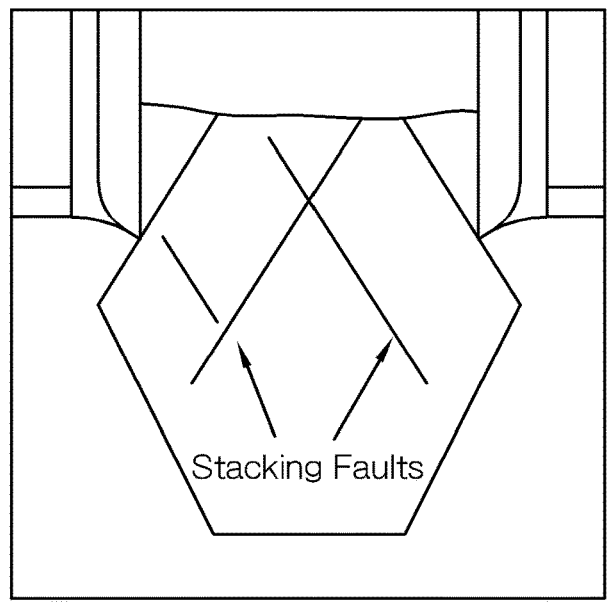
FIG. 2A is an image showing stacking faults in a source/drain of a P-channel field-effect transistor (FET).
Figure 2B:
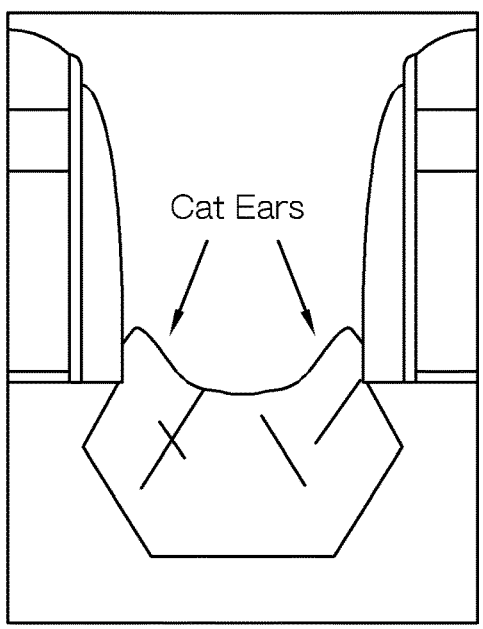
FIG. 2B is an image showing cat ears in a source/drain of an N-channel FET.

FIGS. 2A and 2B are transmission electron microscopy (TEM) images respectively showing an SiGe source/drain of a P-channel FET and an Si:P source/drain of an N-channel FET, each of which has a sigma-shaped recess similar to the S/D recess 106 of the semiconductor device 100. As shown in FIGS. 2A and 2B, with such a recess, stacking faults in the SiGe source/drain of the P-channel FET and cat ears in the Si:P source/drain of the N-channel FET can occur.

Figure 3A:
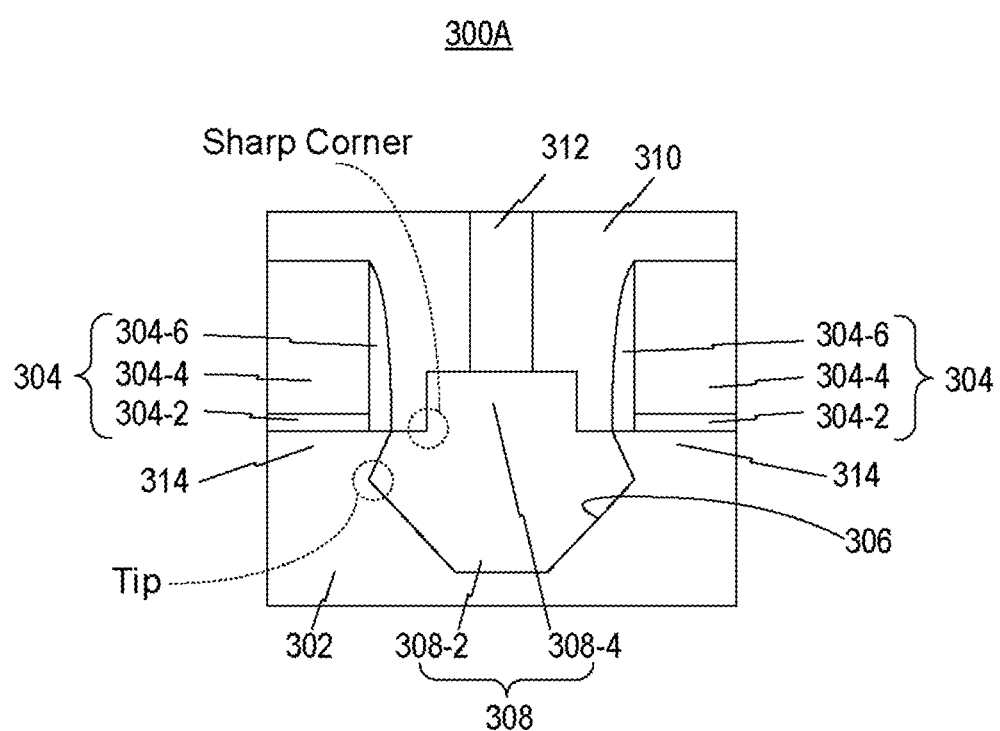
FIGS. 3A-3D are cross-sectional views schematically showing semiconductor devices according to exemplary embodiments.

FIG. 3A schematically shows an exemplary semiconductor device 300A consistent with the present disclosure. The semiconductor device 300A includes a substrate 302, two gate structures 304 formed over the substrate 302, a source/drain (S/D) recess 306 formed in the substrate 302 and between the gate structures 304, a raised source/drain 308 formed in and over the S/D recess 306 and between the gate structures 304, an interlayer dielectric layer 310 formed over the substrate 302, the gate structures 304, and the source/drain 308, and an S/D contact 312 formed through the interlayer dielectric layer 310 and in contact with the source/drain 308. Portions of the substrate 302 below the gate structures 304 serve as channel regions 314. Since a semiconductor device consistent with the present disclosure has a symmetric structure, hereinafter, the description will be made with respect to components at one side of the semiconductor device, unless both sides are mentioned.

The substrate 302 includes a semiconductor substrate, such as an N type silicon (Si) substrate. The two gate structures 304 share one source/drain 308 and each corresponds to one field-effect transistor (FET). In this example, each FET is a P-channel FET. The gate structure 304 includes a gate dielectric layer 304-2 formed over the substrate 302, a gate electrode 304-4 formed over the gate dielectric layer 304 2, and a spacer 304-6 formed on the side surfaces of the gate dielectric layer 304-2 and the gate electrode 304-4. The gate dielectric layer 304-2 can be formed of, e.g., silicon oxide ($SiO_2$) or a high-k material such as hafnium silicate ($HfO_4Si$). The gate electrode 304-4 can be formed of, e.g., polycrystalline Si. The spacer 304-6 can be a single spacer made of, e.g., silicon nitride ($Si_3N_4$) or silicon oxynitride ($SiO_xN_y$), or a composite spacer including a combination of, e.g., a $Si_3N_4$ layer and a $SiO_xN_y$ layer. In some embodiments, the gate structure 304 further includes a cap layer (not shown) formed over the gate electrode 304-4. The cap layer can be formed of, e.g., $Si_3N_4$. In such embodiments, the spacer 304-6 can be formed on the side surfaces of the gate dielectric layer 304-2, the gate electrode 304-4, and the cap layer.

Figure 3B:
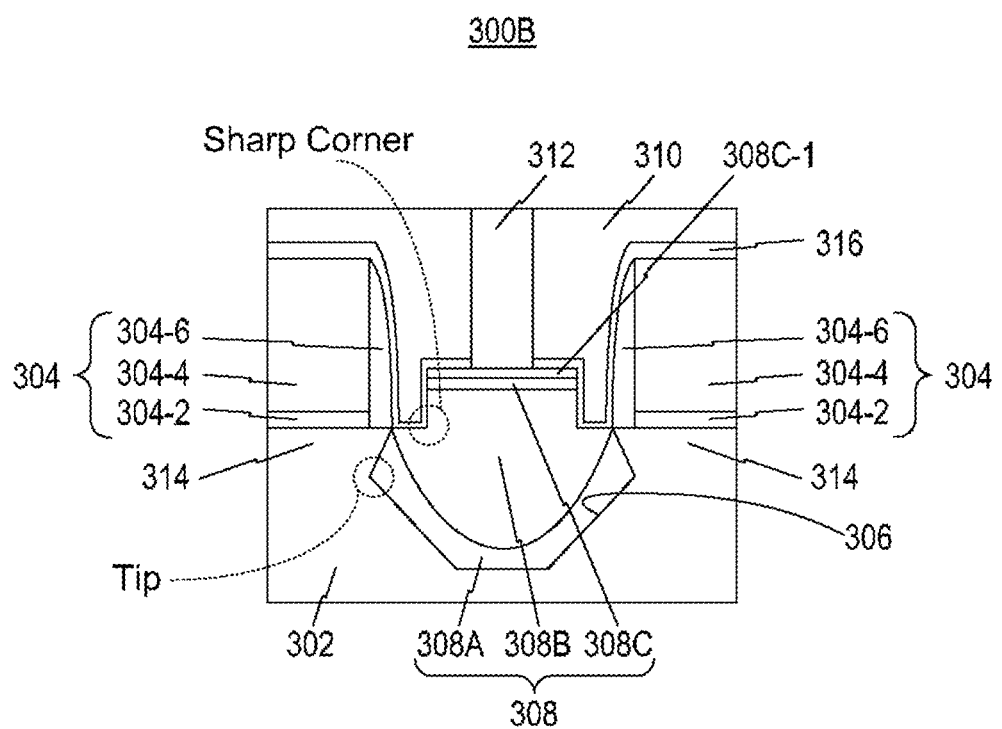

The source/drain 308 is formed near the gate structures 304 and can function as either the source or the drain of each FET of the semiconductor device 300A. The source/drain 308 includes an epitaxial structure containing a material that is capable of exerting a stress on the channel region 314, such as silicon-germanium (SiGe). The SiGe can be doped with a P-type dopant, such as boron (B). In some embodiments, the source/drain 308 can include a composite epitaxial structure. For example, FIG. 3B schematically shows another exemplary semiconductor device 300B consistent with the present disclosure. In the semiconductor device 300B, the source/drain 308 includes a buffer SiGe layer 308A, a bulk SiGe layer 308B formed over the buffer SiGe layer 308A, and an Si cap layer 308C formed over the bulk SiGe layer 308B. At least a portion of the Si cap layer 308C can be silicided to reduce a contact resistance between the source/drain 308 and the contact 312. In the example shown in FIG. 3B, an entire top surface of the Si cap layer 308C is silicided to form a silicided layer 308C-1. In some embodiments, only the portion of the top surface of the Si cap layer 308C at which the contact 312 lands is silicided.

In some embodiments, as shown in FIG. 3B, the interlayer dielectric layer 310 includes a contact etch stop layer 316, which is formed at the bottom of the interlayer dielectric layer 310. The contact etch stop layer 316 helps to improve etching uniformity when the interlayer dielectric layer 310 is etched to form an opening for the contact 312.

Referring again to FIG. 3A, the source/drain 308 includes a buried portion 308-2 formed in the S/D recess 306 and an elevated portion 308-4 formed over the S/D recess 306. That is, the buried portion 308 2 is formed below the top surface of the substrate 302 while the elevated portion 308-4 extends vertically (as viewed in FIG. 3A) above the top surface of the substrate 302. As shown in FIG. 3A, the buried portion 308 2 extends laterally, i.e., horizontally (as viewed in FIG. 3A), toward the channel region 314 and beyond the elevated portion 308-4, i.e., the lateral end, i.e., the tip in this example, as labeled in FIG. 3A, of the buried portion 308-2 is laterally closer to the gate structure 304 than the lateral end, i.e., the side surface, of the elevated portion 308-4.

Figure 3C:
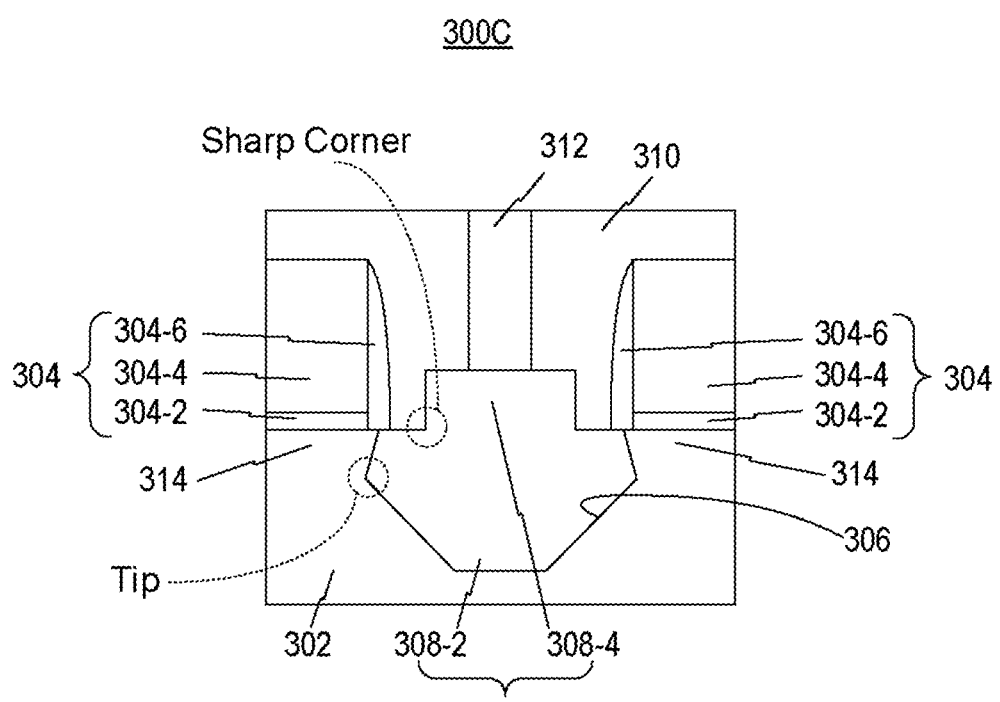
Figure 3D:
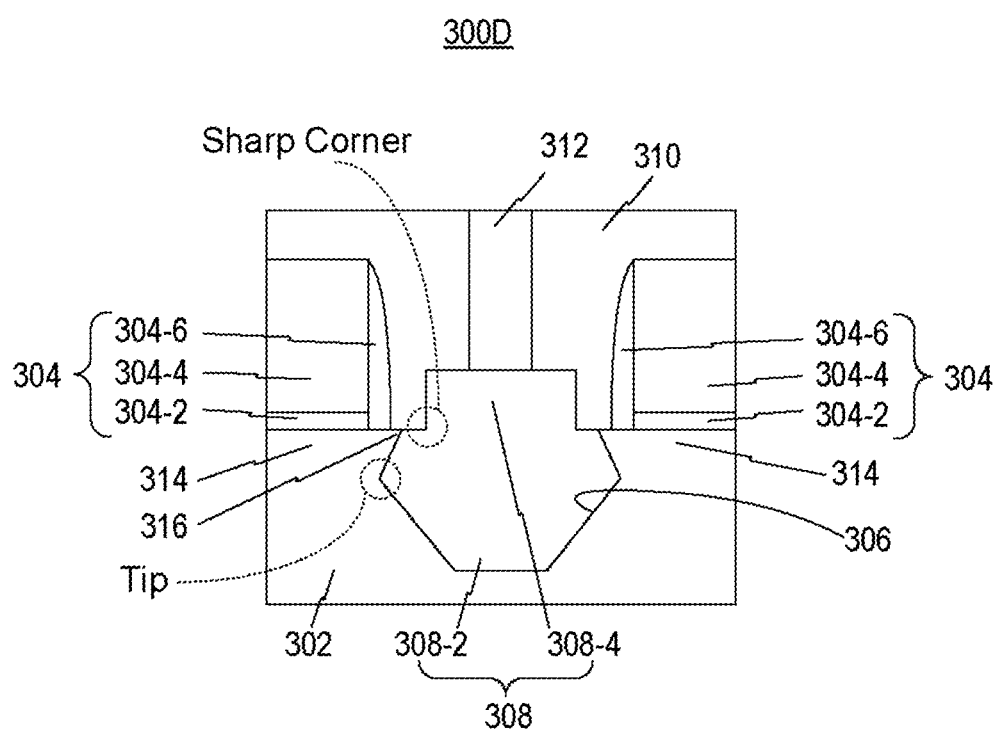

The interlayer dielectric layer 310 can be made of, e.g., $SiO_2$. As shown in FIG. 3A, a portion of the interlayer dielectric layer 310 is formed between the side surface of the elevated portion 308-4 and the side surface of the spacer 304-6, i.e., the side surface of the gate structure 304. Further, a top surface of the part of the buried portion 308-2 that extends laterally beyond the elevated portion 308-4 directly contacts the interlayer dielectric layer 310. In the exemplary semiconductor device 300A shown in FIG. 3A, the top surface of the part of the buried portion 308-2 that extends laterally beyond the elevated portion 308-4 does not directly contact the spacer 304-6. FIG. 3C schematically shows another exemplary semiconductor device 300C consistent with the present disclosure. The semiconductor device 300C is similar to the semiconductor device 300A, except that in the semiconductor device 300C, the top surface of the part of the buried portion 308-2 that extends laterally beyond the elevated portion 308-4 also directly contacts the spacer 304-6. Further, FIG. 3D shows another exemplary semiconductor device 300D consistent with the present disclosure. The semiconductor device 300D is also similar to the semiconductor device 300A, except that in the semiconductor device 300D, the part of the buried portion 308-2 that extends laterally beyond the elevated portion 308-4 does not extend as far as the same part in the semiconductor device 300A. That is, in the semiconductor device 300D, a portion 316 of the substrate 302 is exposed between the spacer 304-6 and the buried portion 308-2, and is in direct contact with the interlayer dielectric layer 310.

According to the present disclosure, the position of the lateral end, i.e., the tip in the above-described examples, as labeled in FIGS. 3A-3D, of the buried portion 308-2 and the position of the side surface of the elevated portion 308-4 can be individually controlled during the process for making the semiconductor devices 300A, 300B, 300C, and 300D. That is, the lateral end of the buried portion 308-2 can be made closer to the gate structure 304 without reducing the horizontal distance between the side surface of the elevated portion 308-4 and the side surface of the gate electrode 304-4. For example, in an FET with a 40-nm linewidth according to the present disclosure, the horizontal distance between the lateral end of the buried portion 308-2 and the vertical plane on which the side surface of the gate electrode 304 4 is disposed, also referred to herein as the T2G distance, can be controlled to be smaller than, e.g., about 35 Å, while the horizontal distance between the side surface of the elevated portion 308-4 and the vertical plane on which the side surface of the gate electrode 304-4 is disposed, also referred to herein as the S2G distance, can be controller to be larger than, e.g., about 70 Å. Moreover, the vertical distance from the tip of the S/D recess 306, i.e., the tip of the buried portion 308-2 to the surface of the substrate 302, also referred to herein as the sigma depth can be controlled to be around 70 Å, and the vertical distance from the bottom of the S/D recess 306, i.e., the bottom of the buried portion 308-2 to the surface of the substrate 302, also referred to herein as the recess depth, can be controlled to be around 450 Å.

Figure 4:
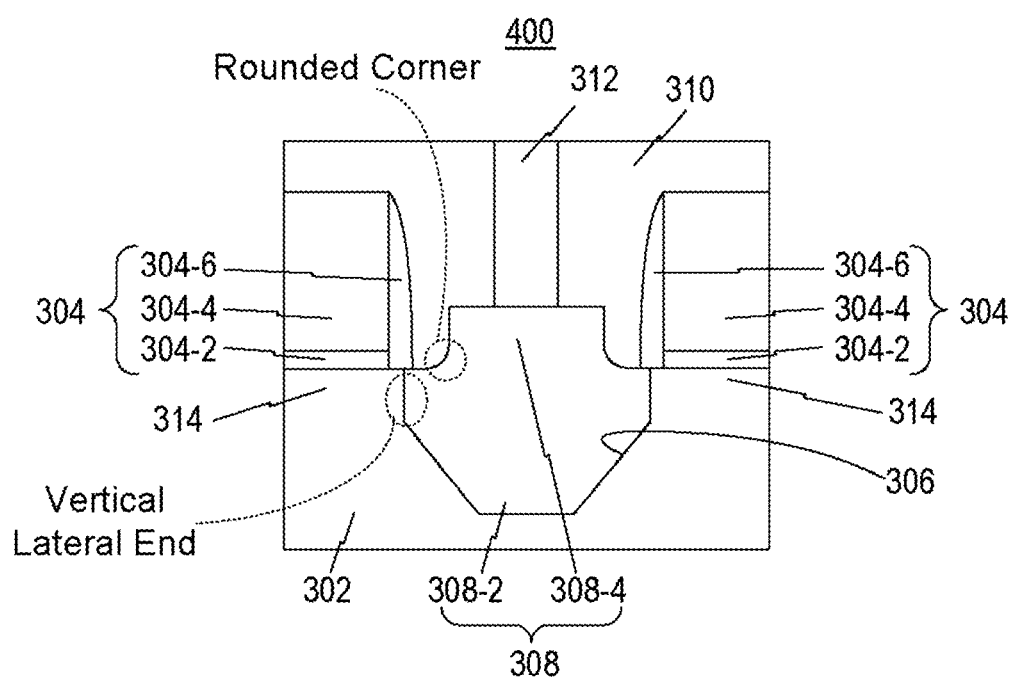
FIG. 4 is a cross-sectional view schematically showing a semiconductor device according to another exemplary embodiment.

In the examples shown in FIGS. 3A 3D, the lateral end of the buried portion 308 2 forms a tip. Further, the corner formed by the buried portion 308-2 and the elevated portion 308-4 is relatively sharp. However, semiconductor devices consistent with the present disclosure are not limited by these geometric characteristics. For example, FIG. 4 schematically shows another exemplary semiconductor device 400 consistent with the present disclosure. The semiconductor device 400 is similar to the semiconductor device 300C, except that in the semiconductor device 400, the lateral end of the buried portion 308-2 includes a side surface that is nearly vertical. The lower end of the side surface of the buried portion 308-2 can be considered to be a tip. In some embodiments, the lateral end of the buried portion 308-2 can also include a rounded side surface (not shown in FIG. 4). Further, in the semiconductor device 400, the buried portion 308-2 and the elevated portion 308-4 meet to form a rounded corner rather than a sharp corner.

In the example shown in FIG. 4, the nearly-vertical side surface of the buried portion 308-2 is formed below the spacer 304 6. However, similar to the examples shown in FIGS. 3A and 3D, the side surface of the buried portion 308-2 can either be approximately below an edge of the spacer 304-6 that is adjacent to the elevated portion 308-4 or below a position between the spacer 304-6 and the elevated portion 308-4.

Figure 5A:
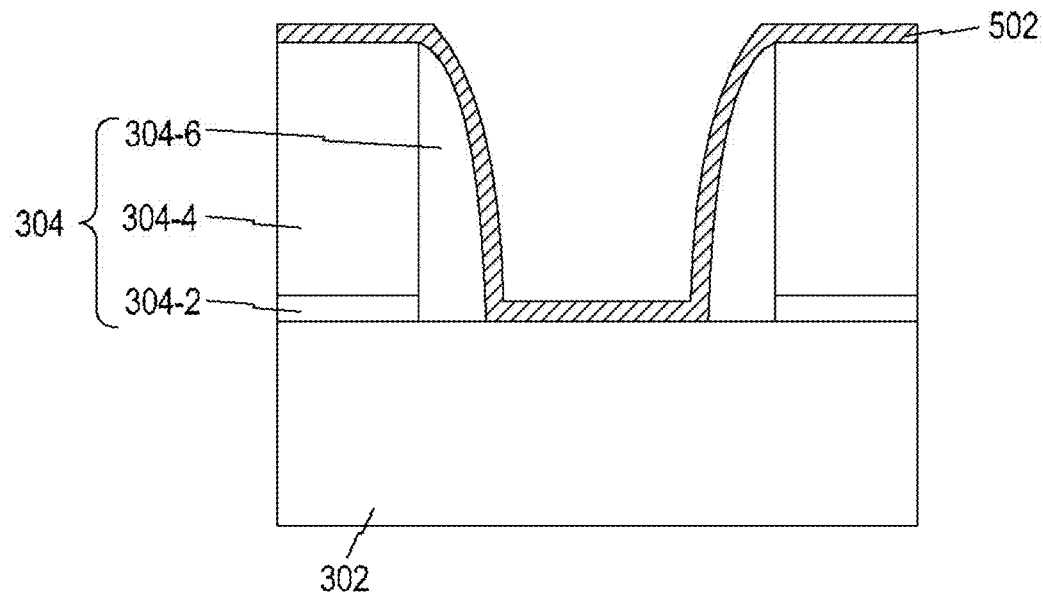
FIGS. 5A-5G schematically show a process for manufacturing the semiconductor device shown in FIG. 3.

FIGS. 5A-5G show an exemplary process for manufacturing a semiconductor device consistent with the present disclosure, where the semiconductor device can be, for example, the semiconductor device 300A shown in FIG. 3A and includes P-channel FETs. As shown in FIG. 5A, the gate structures 304 are formed over the substrate 302, with a portion of the substrate 302 exposed and not covered by the gate structures 304. A capping layer 502 is deposited over the gate structures 304 and the exposed portion of the substrate 302. The capping layer 502 can be a thin $Si_3N_4$ layer and can also be referred to as a seal nitride layer.

Figure 5B:
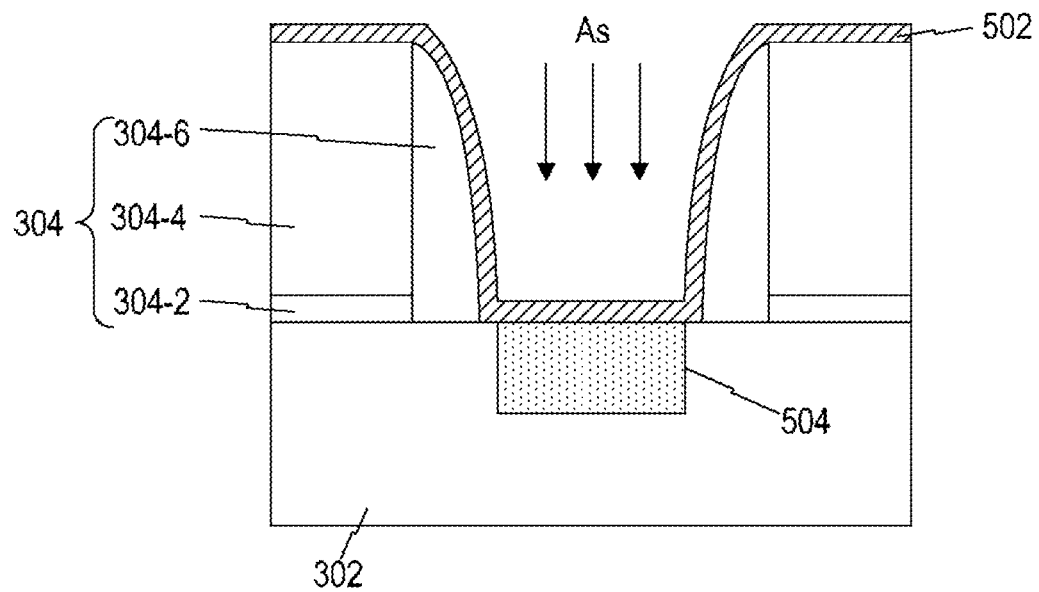

As shown in FIG. 5B, arsenic (As) ions are implanted into the exposed portion of the substrate 302 through the capping layer 502, to form an As-implanted region 504 in the substrate 302. The profile of the As-implanted region 504 can affect the profile of the later-formed S/D recess 304 and thus the profile of the buried portion 308-2 of the source/drain 308. For example, the position of the lateral end of the As-implanted region 504 can affect the position of the lateral end of the S/D recess 306, and thus can affect the T2G distance. The closer the lateral end of the As-implanted region 504 to the gate structure 304 is, the closer the lateral end of the S/D recess 306 to the gate structure 304 is, and thus the smaller the T2G distance is. Further, the position of the bottom of the As implanted region 504 can affect the position of the bottom of the S/D recess 306, and thus can affect the recess depth. The lower the bottom of the As-implanted region 504 is, the lower the bottom of the S/D recess 306 is, and thus the larger the recess depth is.

Generally, the profile of the As-implanted region 504 can be controlled by controlling the thickness of the capping layer 502 and the ion implantation conditions. A thicker capping layer 502 would result in a shallower As-implanted region 504. Further, a higher implantation energy would result in a deeper As-implanted region 504. A higher implantation dosage would result in a higher As concentration in the As implanted region 504, which would in turn cause the S/D recess 306 to be deeper and wider. For example, the thickness of the capping layer 502 can be set to about 30 Å, the implantation energy can be set to about 3.5 K eV, and the implantation dosage can be set to about $5 \times 10^{15}$ $cm^{-2}$. Under these conditions, the resulting T2G distance, sigma depth, and recess depth are about 30 Å, about 70 Å, and about 470 Å, respectively.

The ion implantation can be a vertical implantation, in which the As ions are implanted into the substrate 302 vertically, i.e., at an implantation angle of 0 degree. In some embodiments, the ion implantation can be a tilted implantation, in which the As ions are implanted at a non-zero implantation angle. When other conditions are the same, the tilted implantation can result in a wider and shallower As-implanted region 504, and thus a smaller T2G distance and recess depth.

Figure 5C:
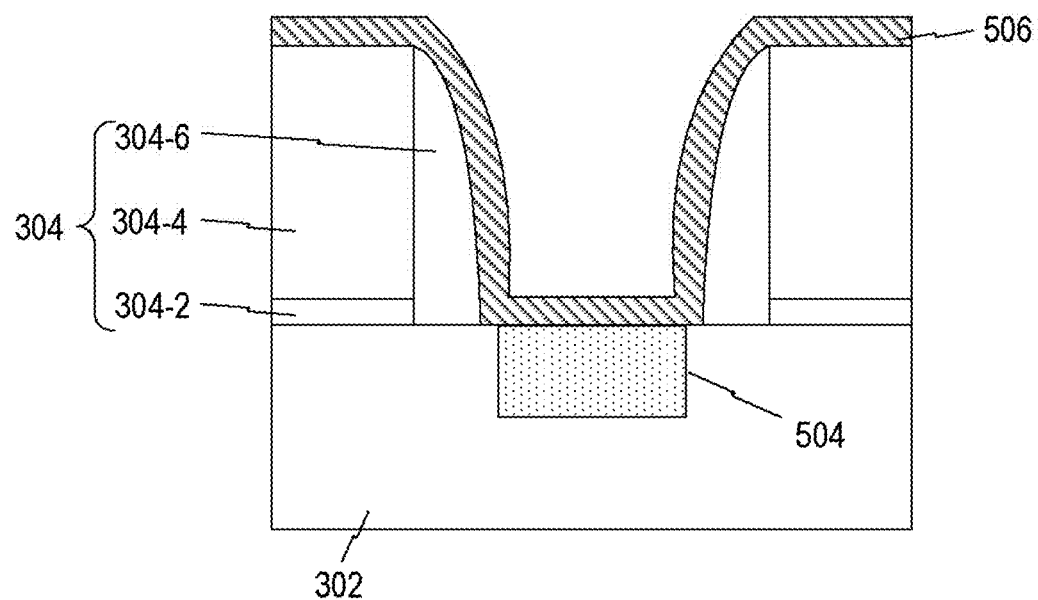

Next, as shown in FIG. 5C, after the As-implanted region 504 is formed, the capping layer 502 is removed and a disposable layer 506 is formed over the gate structures 304 and the exposed portion of the substrate 302. In some embodiments, the capping layer 502 can be removed by a wet etching process, during which, native oxide formed over the exposed portion of the substrate 302 can also be etched away. The disposable layer 506 can, for example, include a nitride layer. The disposable layer 506 is thicker than the capping layer 502, and can be, for example, 160-200 Å.

Figure 5D:
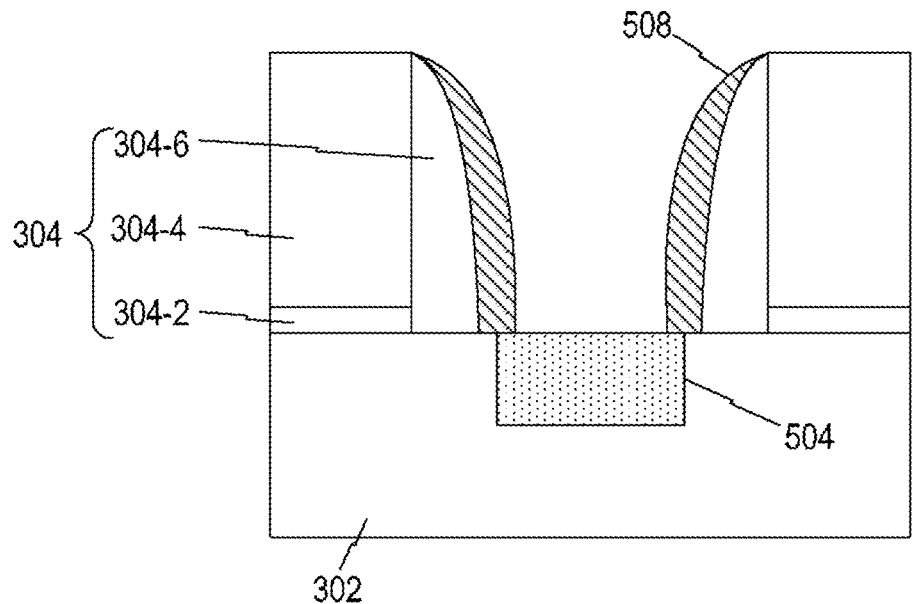

Then, as shown in FIG. 5D, the disposable layer 506 is etched back to form disposable spacers 508, also referred to herein as "etching spacers," on the side surfaces of the gate structures 304. The etching back process removes a portion of the disposable layer 506 that is formed over the As-implanted region 504, exposing a portion of the As-implanted region 504 for further process.

Figure 5E:
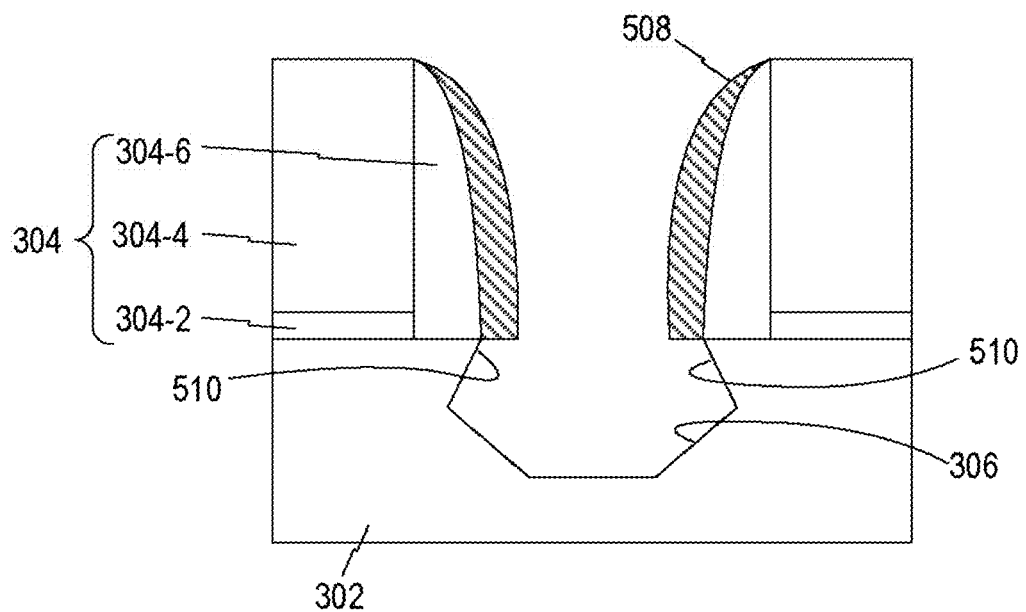

As shown in FIG. 5E, the As-implanted region 504 is etched using the gate structures 304 and the disposable spacers 508 as a mask to form the S/D recess 306. In some embodiments, the As-implanted region 504 can be first etched using a dry etching process and then further etched using a wet etching process. According to the present disclosure, because of the As-implanted region 504, the etching also proceeds laterally, i.e., horizontally, beneath the surface of the substrate 302. As a result of the lateral etching, the S/D recess 306 includes undercut regions 510 at least beneath a portion of the disposable spacers 508. As shown in FIG. 5E, the undercut regions 510 are directly beneath the disposable spacers 508, i.e., no substrate material remains between the undercut regions 510 and the disposable spacers 508. In some embodiments, the undercut regions 510 further extend beneath at least a portion of the gate structures 304, such as beneath at least a portion of the spacers 304-6 of the gate structures 304. The extension of the undercut regions 510 beneath at least a portion of the gate structures 304 can be seen in the final device shown in FIG. 3C. In some embodiments, the undercut regions 510 do not extend beneath the entire bottoms of the disposable spacers 508, but only beneath portions of the disposable spacers 508. The extension of the undercut regions 510 only beneath portions of the disposable spacers 508 can also be seen in the final device shown in FIG. 3D. In such embodiments, portions of the substrate 302 between the spacers 304 6 and the undercut regions 510 remain in direct contact with the disposable spacers 508. The extension of the undercut regions 510 as used herein refers to the extension of the upper ends of the undercut regions 510, i.e., the locations where the undercut regions 510 intersect the substrate surface.

In some embodiments, one or more cleaning processes can follow the etching processes to, for example, remove residues of the etching substances and/or undesired substances formed during the etching processes.

Figure 5F:
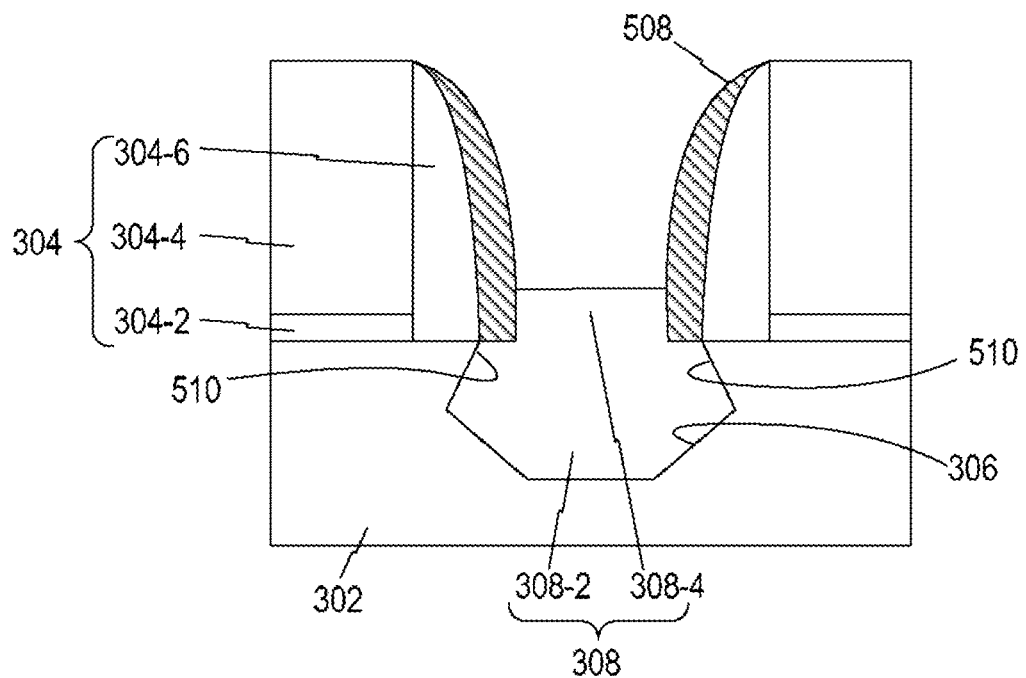

As shown in FIG. 5F, an epitaxial structure is formed in and over the S/D recess 306 by epitaxially growing, e.g., SiGe, in and over the S/D recess 306. The epitaxial structure serves as the source/drain 308. As shown in FIG. 5F, the epitaxial structure completely fills the S/D recess 306, including the undercut regions 510. That is, the buried portion 308-2 of the source/drain 308 also extends laterally directly beneath the disposable spacers 508, with the top surfaces of the lateral extending parts of the buried portion 308-2 directly contacting the bottom surfaces of the disposable spacers 508.

In some embodiments, to form an SiGe source/drain 308, a buffer layer of SiGe can be first deposited in the S/D recess 306 and then a bulk layer of SiGe can be deposited over the buffer layer. The buffer layer can have a lower Ge concentration than the bulk layer, such that the lattice constant difference between the buffer layer and the substrate 302 is relatively small. This helps to prevent defects from being formed in the source/drain 308. In some embodiments, a silicon cap layer is formed over the bulk layer. The silicon cap layer can later be silicided to form a contact layer.

Figure 5G:
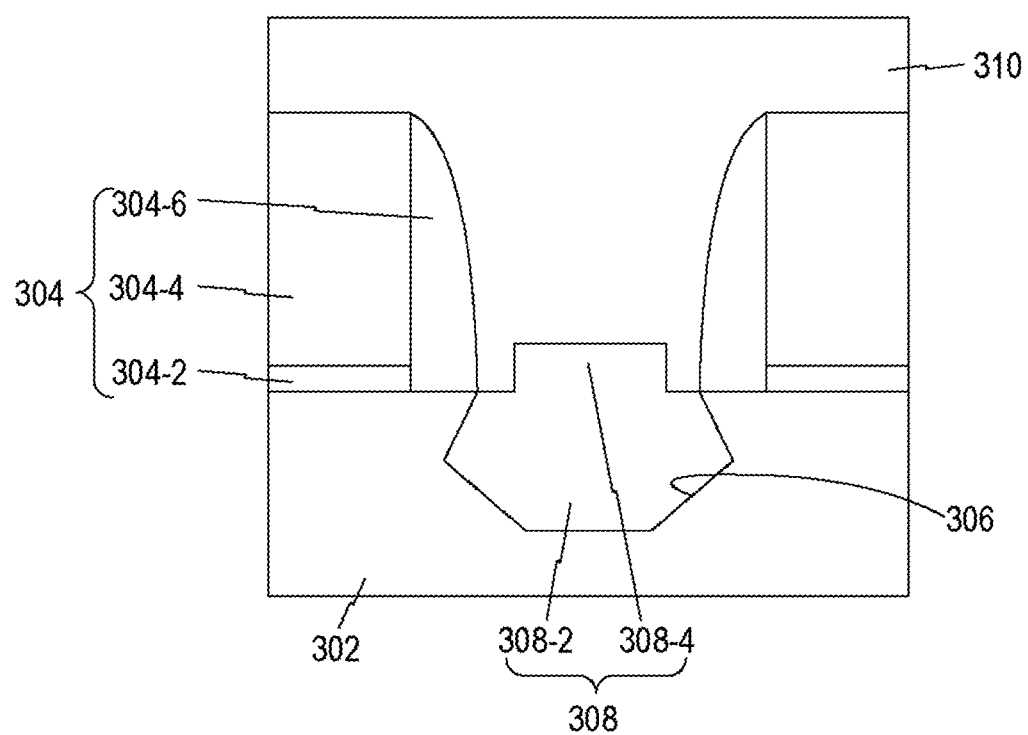

After the source/drain 308 is formed, as shown in FIG. 5G, the disposable spacers 508 are removed, for example, by wet etching, and the interlayer dielectric layer 310 is formed over the gate structures 304 and the source/drain 308, including the elevated portion 308-4 and the lateral extending parts of the buried portion 308-2. Thus, a portion of the interlayer dielectric layer 310 is formed between the elevated portion 308 4 of the source/drain 308 and the bottom surface of that portion of the interlayer dielectric layer 310 directly contacts the top surface of the lateral extending part of the buried portion 308-2.

Then, a through hole is formed in the interlayer dielectric layer 310 to expose a portion of the source/drain 308, and a metal material, such as tungsten (W), is deposited into the through hole to form the S/D contact 312. As a result, the semiconductor device 300A shown in FIG. 3A is formed.

Figure 6:
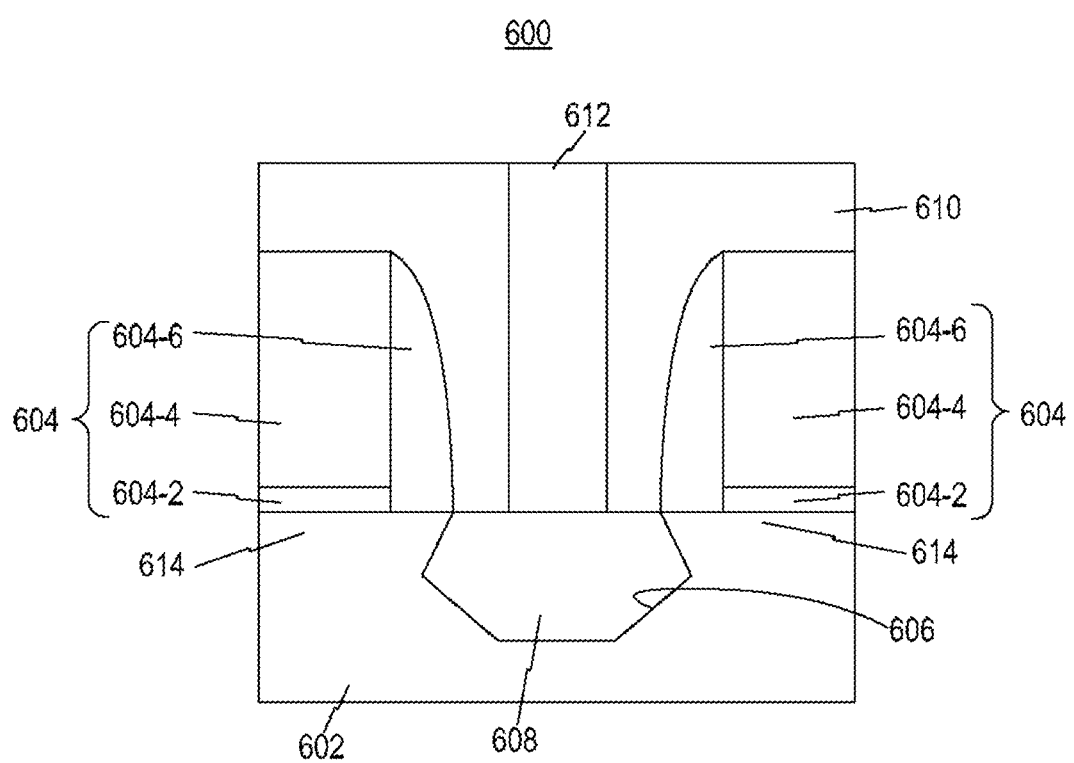
FIG. 6 is a cross-sectional view schematically showing a semiconductor device according to another exemplary embodiment.

FIG. 6 schematically shows another exemplary semiconductor device 600 consistent with the present disclosure. The semiconductor device 600 includes a substrate 602, two gate structures 604 formed over the substrate 602, an S/D recess 606 formed in the substrate 602 and between the gate structures 604, a source/drain 608 formed in the S/D recess 606, an interlayer dielectric layer 610 covering the substrate 602, the gate structures 604, and the source/drain 608, and an S/D contact 612 formed through the interlayer dielectric layer 610 and in contact with the source/drain 608. Portions of the substrate 602 below the gate structures 604 serve as channel regions 614.

The substrate 602 includes a semiconductor substrate, such as a P type silicon (Si) substrate. The two gate structures 604 share one source/drain 608 and each correspond to one field-effect transistor (FET). In this example, each of the FETs of the semiconductor device 600 is an N-channel FET. The gate structure 604 includes a gate dielectric layer 604 2 formed over the substrate 602, a gate electrode 604-4 formed over the gate dielectric layer 604 2, and a spacer 604-6 formed on the side surfaces of the gate dielectric layer 604-2 and the gate electrode 604-4. The gate structures 604 can be similar to the gate structures 304 described above, and thus their detailed description is omitted here.

The source/drain 608 is formed near the gate structures 604 and can function as either the source or the drain of the semiconductor device 600. The N-channel FETs in the exemplary semiconductor device 600 utilize electrons, rather than holes, in the channels to form conducting currents when operating, and the mobility of electrons is usually much higher than the mobility of holes. Therefore, a same or similar material as that in the substrate 602 can be used for the source/drain 608. Thus, the source/drain 608 includes an epitaxial structure made of, for example, Si that is doped with an N-type dopant, such as phosphorous-doped Si (Si:P). Since Si is used for both the substrate 602 and the source/drain 608, the source/drain 608 does not include an elevated portion, as shown in FIG. 6. Further, as shown in FIG. 6, the source/drain 608 extends laterally toward the channel region 614.

The interlayer dielectric layer 610 and the contact 612 can be similar to the interlayer dielectric layer 310 and the contact 312 in the semiconductor device 300A, and thus their detailed description is omitted here.

Hereinafter, an exemplary process for manufacturing a semiconductor device consistent with the present disclosure will be described, where the semiconductor device can be, for example, the semiconductor device 600 shown in FIG. 6 including N-channel FETs. During the process of manufacturing the semiconductor device 600, the first several steps for forming the S/D recess 606 are similar to the steps for forming the S/D recess 306 in the process of manufacturing the semiconductor device 300A described above with reference to FIGS. 5A-5E, and thus their detailed description is omitted here.

Figure 7A:
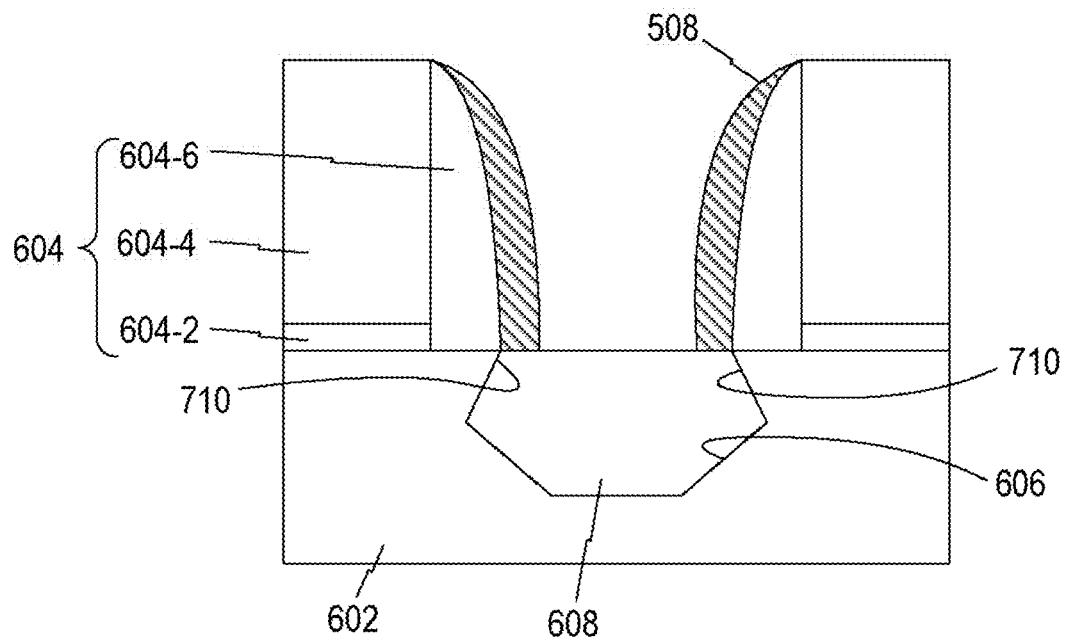
FIGS. 7A and 7B schematically show steps of a portion of a process for manufacturing the semiconductor device shown in FIG. 6.
Figure 7B:
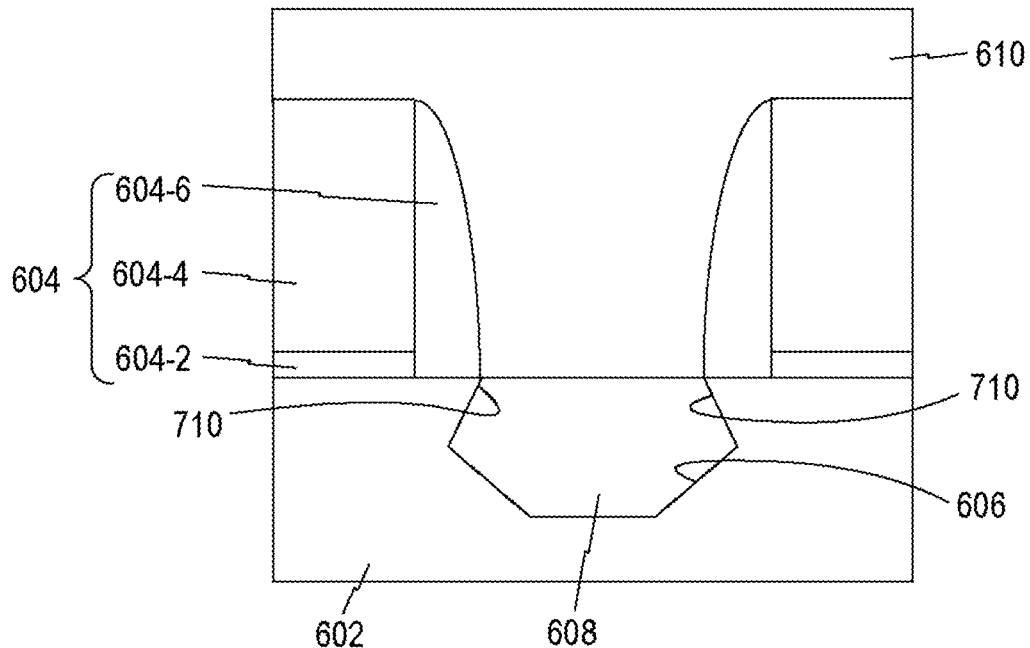

FIGS. 7A and 7B show subsequent steps in manufacturing the semiconductor device 600. As shown in FIG. 7A, an epitaxial structure is formed in the S/D recess 606 by epitaxially growing, e.g., Si:P, in the S/D recess 606. The epitaxial structure serves as the source/drain 608. As shown in FIG. 7A, the epitaxial structure completely fills the S/D recess 606, including undercut regions 710. That is, the source/drain 608 also extends laterally directly beneath the disposable spacers 508, with the top surfaces of the lateral extending part of the source/drain 608 directly contacting the bottom surfaces of the disposable spacers 508.

In some embodiments, to form an Si:P source/drain 608, a buffer layer of Si:P can be first deposited in the S/D recess 606 and then a bulk layer of Si:P can be deposited over the buffer layer. The buffer layer can have a lower P concentration than the bulk layer.

After the source/drain 608 is formed, as shown in FIG. 7B, the disposable spacers 508 are removed and the interlayer dielectric layer 610 is formed over the gate structures 604 and the source/drain 608, including the lateral extending parts of the source/drain 608, which are exposed due to the removal of the disposable spacers 508. Thus, a portion of the interlayer dielectric layer 610 fills in the space left by removing the disposable spacers 508 and the bottom surface of that portion of the interlayer dielectric layer 610 directly contacts the top surface of the lateral extending part of the source/drain 608.

Then, a through hole is formed in the interlayer dielectric layer 610 to expose a portion of the source/drain 608, and a metal material, such as W, is deposited into the through hole to form the S/D contact 612. As a result, the semiconductor device 600 shown in FIG. 6 is formed.

Figure 8A:
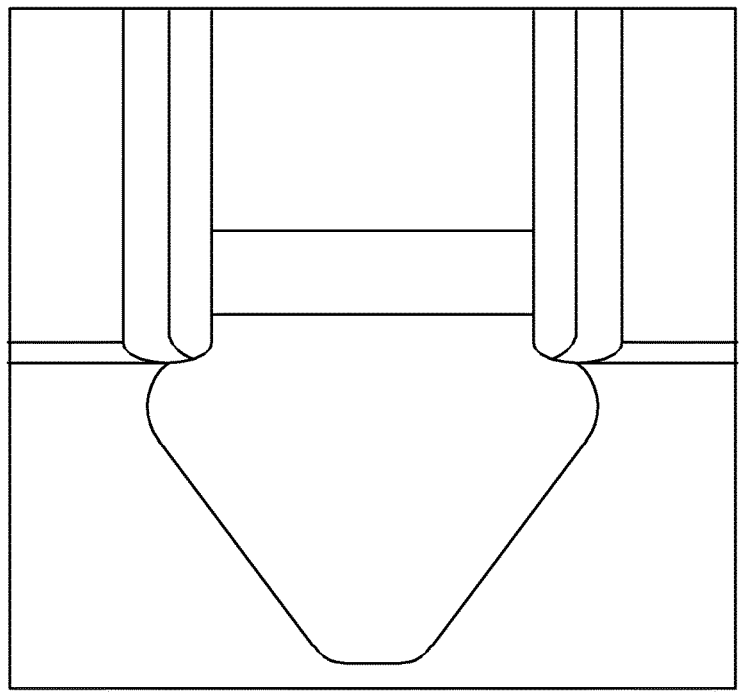
FIGS. 8A and 8B are images each showing a source/drain of an FET having a recess according to the present disclosure.
Figure 8B:
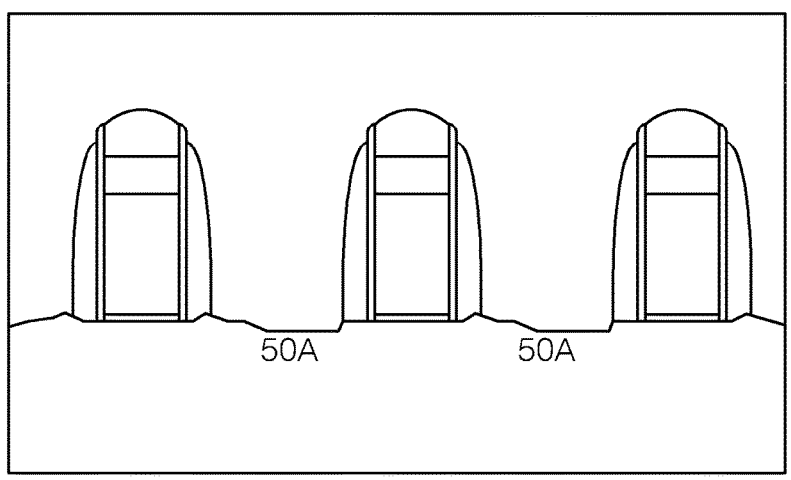

FIGS. 8A and 8B are images respectively showing an SiGe source/drain of a P-channel FET and an Si:P source/drain of an N-channel FET consistent with the present disclosure. The SiGe source/drain in FIG. 8A has a Ge concentration of about 44.7%, and no stacking fault is observed. As a comparison, the SiGe source/drain of the conventional P-channel FET shown in FIG. 2A has a lower Ge concentration of about 42.8%, but has clearly observable stacking faults. Further, as shown in FIG. 8B, no cat ear is observed.

Figure 9A:
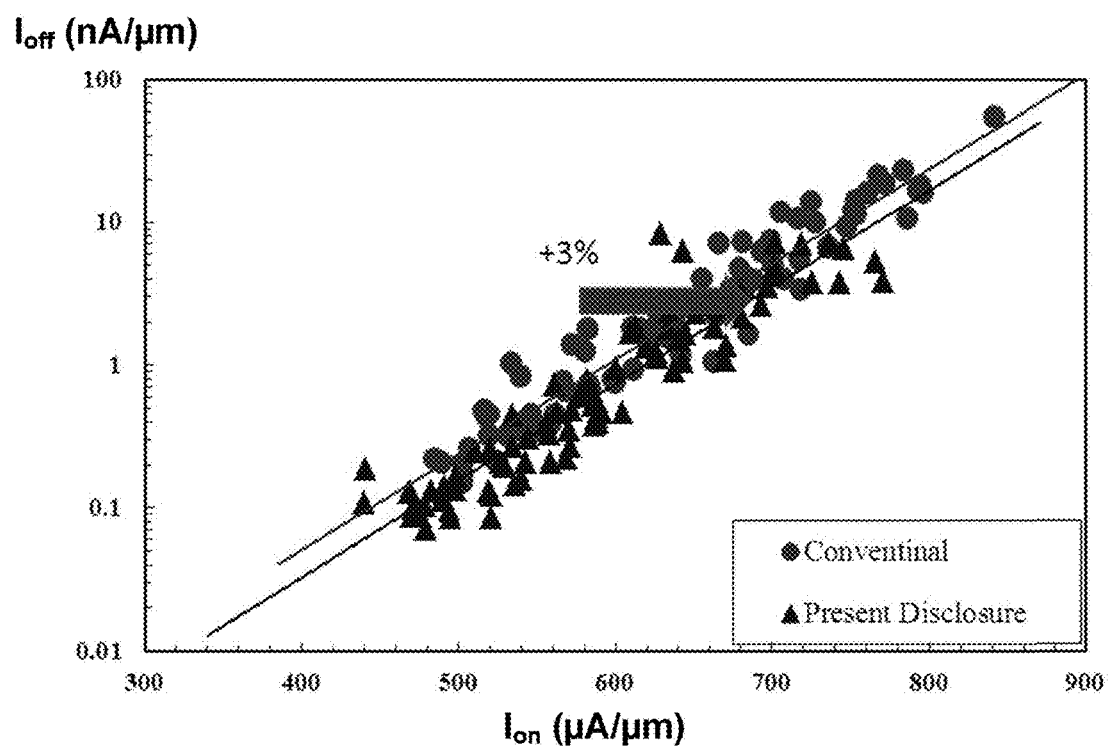
FIGS. 9A and 9B show the comparison between electrical characteristics of a conventional FET and electrical characteristics of an FET according to the present disclosure.
Figure 9B:
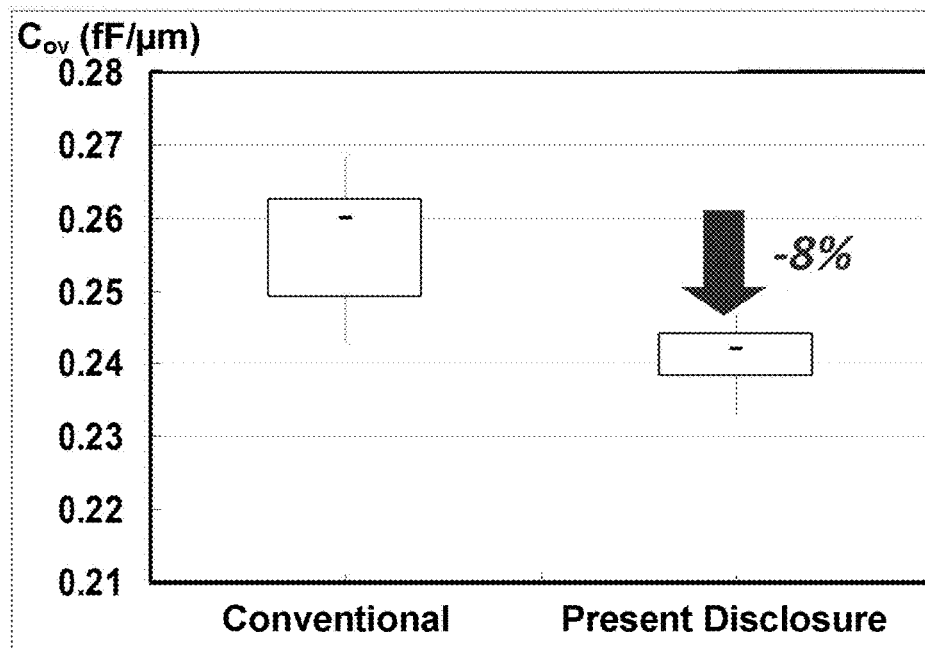

FIGS. 9A and 9B show a comparison between electrical characteristics of a conventional P-channel FET and a P-channel FET consistent with the present disclosure. Specifically, FIG. 9A shows an off-current, $I_{off}$, versus an on-current, $I_{on}$. A higher $I_{on}$ at the same $I_{off}$ means the FET has a higher hole mobility. In FIG. 9A, the circular dots represent the measurement results of the conventional FET and the triangular dots represent the measurement results of the FET consistent with the present disclosure. As shown in FIG. 9A, the $I_{on}/I_{off}$ ratio of the FET consistent with the present disclosure is greater by about 3% than that of the conventional FET.

FIG. 9B shows a comparison of the parasitic capacitance $C_{ov}$. As shown in FIG. 9B, $C_{ov}$ in the FET consistent with the present disclosure is less by about 8% than that of the conventional FET.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor substrate;
   a gate structure formed over the semiconductor substrate, wherein the gate structure includes:
   a gate dielectric layer formed over the semiconductor substrate;
   a gate electrode formed over the gate dielectric layer; and
   a spacer formed onside surfaces of the gate dielectric layer and the gate electrode; and
   an epitaxial structure, as one of a source or drain region corresponding to the gate structure, formed partially within the semiconductor substrate, a laterally extending portion of the epitaxial structure extending laterally at an area below a top surface of the semiconductor substrate in a direction toward an area below the gate structure, wherein a lateral end of the laterally extending portion is below the spacer.

2. The semiconductor device of claim 1, wherein a vertically extending portion of the epitaxial structure extends vertically above the top surface of the semiconductor substrate in an area adjacent the gate structure.

3. The semiconductor device of claim 2, further comprising:
   an interlayer dielectric layer between a side surface of the vertically extending portion of the epitaxial structure and a side surface of the gate structure.

4. The semiconductor device of claim 3, wherein a top surface of the laterally extending portion of the epitaxial structure directly contacts the interlayer dielectric layer.

5. The semiconductor device of claim 3, further comprising:
   a metal contact formed through the interlayer dielectric layer and contacting the epitaxial structure.

6. The semiconductor device of claim 2, wherein the laterally extending portion of the epitaxial structure extends laterally at the area below the top surface of the semiconductor substrate in a direction beyond an area where the epitaxial structure extends vertically.

7. The semiconductor device of claim 2, wherein the epitaxial structure has a rounded corner where the vertically extending portion of the epitaxial structure joins the laterally extending portion of the epitaxial structure.

8. The semiconductor device of claim 1, wherein a top surface of the laterally extending portion of the epitaxial structure directly contacts the spacer of the gate structure.

9. The semiconductor device of claim 1, wherein the lateral end of the laterally extending portion directly contacts the spacer of the gate structure.

10. The semiconductor device of claim 1, wherein the lateral end of the laterally extending portion of the epitaxial structure includes a side surface that is nearly vertical.

11. The semiconductor device of claim 1, wherein the semiconductor substrate includes an Si substrate.

12. The semiconductor device of claim 11, wherein the epitaxial structure includes an SiGe epitaxial layer.

13. The semiconductor device of claim 12, wherein the SiGe epitaxial layer includes a buffer SiGe layer and a bulk SiGe layer formed over the buffer SiGe layer, the bulk SiGe layer having a higher Ge concentration than the buffer SiGe layer.

14. The semiconductor device of claim 13, wherein the bulk SiGe layer contains about 45% Ge.

15. The semiconductor device of claim 12, wherein the epitaxial structure further includes an Si cap layer formed over the SiGe epitaxial layer.

* * * * *